(12) United States Patent
Cabanillas et al.

(10) Patent No.: US 11,397,207 B2
(45) Date of Patent: Jul. 26, 2022

(54) SYSTEM FOR ANALYSING FAULTS BY REFLECTOMETRY OF OPTIMISED DYNAMIC RANGE

(71) Applicant: COMMISSARIAT A L'ENERGIE ATOMIQUE ET AUX ENERGIES ALTERNATIVES, Paris (FR)

(72) Inventors: Esteban Cabanillas, Orsay (FR); Antoine Dupret, Orsay (FR); Pierre Vincent, Villars de Lans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/290,972

(22) PCT Filed: Oct. 30, 2019

(86) PCT No.: PCT/EP2019/079577
§ 371 (c)(1),
(2) Date: May 3, 2021

(87) PCT Pub. No.: WO2020/094469
PCT Pub. Date: May 14, 2020

(65) Prior Publication Data
US 2022/0034953 A1    Feb. 3, 2022

(30) Foreign Application Priority Data
Nov. 9, 2018  (FR) ...................................... 1860328

(51) Int. Cl.
*G01R 31/11*    (2006.01)

(52) U.S. Cl.
CPC .................................... *G01R 31/11* (2013.01)

(58) Field of Classification Search
CPC ........ G01R 31/11; G01R 27/06; G01R 29/08; G01R 29/085; G01R 31/00; G01R 31/08;
(Continued)

(56) References Cited

U.S. PATENT DOCUMENTS

2010/0211348 A1* 8/2010 Gray ...................... G01R 31/11
702/124
2013/0182753 A1* 7/2013 Delforce ................ G01R 23/20
375/228

(Continued)

FOREIGN PATENT DOCUMENTS

FR        3 034 203 A1    9/2016
WO     2014/180663 A1   11/2014

*Primary Examiner* — Son T Le
(74) *Attorney, Agent, or Firm* — BakerHostetler

(57) ABSTRACT

A system for analyzing faults in a transmission line includes a test signal generator, a coupler for injecting the test signal into the transmission line and sampling the signal back-propagated in the transmission line, a control unit for generating a calibration signal equal to the opposite of the test signal and controlling its phase and its amplitude, at least one combiner for combining the calibration signal and the signal sampled by the coupler into a corrected signal, an amplifier for amplifying the corrected signal and a correlator for correlating the corrected signal and the test signal to produce a reflectogram, the control unit being further configured to make the amplitude and the phase of the calibration signal vary so as to eliminate, in the signal sampled by the coupler, at least one echo of the test signal on at least one point of impedance mismatch of the transmission line.

16 Claims, 9 Drawing Sheets

(58) Field of Classification Search
CPC .... G01R 27/16; G01R 27/26; G01R 27/2605; G01R 31/085
See application file for complete search history.

(56) References Cited

U.S. PATENT DOCUMENTS

2019/0229981 A1* 7/2019 Chappell .................. H04B 3/46
2019/0293706 A1* 9/2019 Sohn ....................... G01R 23/16

* cited by examiner

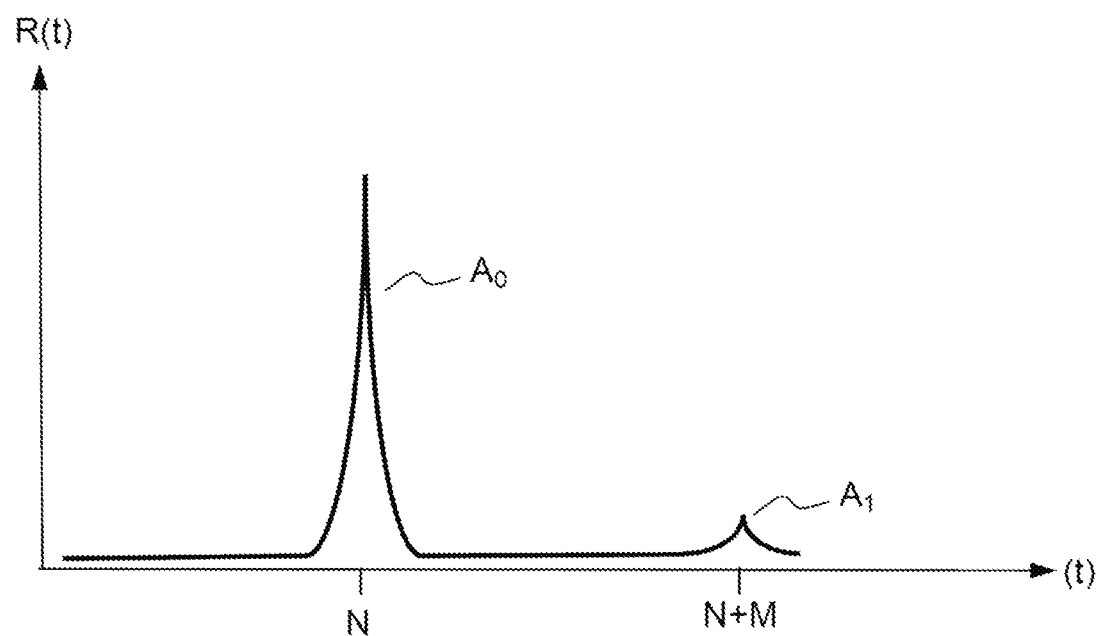
FIG.1bis

SYSTEM FOR ANALYSING FAULTS BY REFLECTOMETRY OF OPTIMISED DYNAMIC RANGE

CROSS-REFERENCE TO RELATED APPLICATIONS

This application is a National Stage of International patent application PCT/EP2019/079577, filed on Oct. 30, 2019, which claims priority to foreign French patent application No. FR 1860328, filed on Nov. 9, 2018, the disclosures of which are incorporated by reference in their entirety.

FIELD OF THE INVENTION

The invention relates to the field of wire diagnostic systems based on the principle of reflectometry. It relates more specifically to a system with optimized dynamic range incorporating a calibration member allowing the elimination, in the signal sampled on the cable to be tested, of one or more peaks associated with impedance discontinuities induced by the mismatch between the measurement device and the cable or by particular points of the topology of a cable network.

BACKGROUND

Cables are everywhere in all electrical systems, for supplying power or for the transmission of information. These cables are subject to the same stresses as the systems that they link together and can be subject to failures. It is therefore necessary to be able to analyze their state and provide information on the detection of faults which impact these cables, such information including the existence of faults, but also their location and their type. Fault analysis provides assistance in cable maintenance. The standard reflectometry methods allow this type of analysis.

The reflectometry methods use a principle close to that of radar: an electrical signal, the probe signal or reference signal, is injected at one or more points of the cable to be tested. The signal is propagated in the cable or the cable network and returns a portion of its energy when it encounters an electrical discontinuity. An electrical discontinuity can result, for example, from a branch connection, from the end of the cable or from a fault or more generally from a break in the conditions of propagation of the signal in the cable. It results from a fault which locally modifies the characteristic impedance of the cable by provoking a discontinuity in its line parameters.

The analysis of the signals returned to the injection point allow information to be deduced on the presence and the location of these discontinuities, therefore possible faults. An analysis in the time or frequency domain is usually performed. These methods are designated by the acronyms TDR, from the expression Time Domain Reflectometry, and FDR, from the expression Frequency Domain Reflectometry.

The invention lies within the field of application of the wire diagnostic methods based on reflectometry and applies to any type of electrical cable, in particular power transmission cables or communication cables, in fixed or mobile installations. The cables concerned can be coaxial, two-wire, in parallel lines, in twisted pairs or of other kinds, provided that it is possible to inject therein a reflectometry signal at a point of the cable and measure its reflection at the same point or at another point.

The accuracy of the reflectometry methods applied to fault diagnosis on transmission lines is strongly linked to the frequency of the reflectometry signals used. Moreover, the attenuation that a signal undergoes in its propagation along a cable is also a function of the frequency. This attenuation increases when the frequency of the signal increases. The attenuation that the signal undergoes after its back-propagation to the reflectometry signal strongly degrades the sensitivity of the system which is determined by the resolution of the analog-digital converter and its quantization noise. Indeed, to detect and locate superficial faults, also called soft faults, the system has to be capable of discriminating, in the calculated reflectogram, peaks of low amplitude which can be embedded in the quantization noise of the converter. It is therefore necessary, for that, to be able to amplify the measured signal in order to enhance the detection of these peaks.

However, another factor constraining the sensitivity of the system is the impedance mismatch between the electronic circuit board implementing the reflectometry system and the cable to be diagnosed. In fact, the impedance of the coupler which connects the board to the cable is, more often than not, not matched to the impedance of the cable which varies according to the nature of the cables to be tested. Thus, a portion of the energy emitted by the reflectometry system is reflected at this coupling interface. The signal acquired is therefore composed of an overlay of echoes that are induced by impedance breaks. Except, the level of the echo linked to the coupling interface is predominant in the acquired signal because it is not attenuated by the propagation losses of the cable. This impedance mismatch defines the maximum dynamic range of the received signal that the system is capable of processing. Thus, the amplification of the measured signal is limited by the level of the echo of the signal on the coupling interface. It is not therefore possible to adequately amplify the measured signal to amplify the signatures of soft faults without saturating the dynamic range of the analog-digital converter.

SUMMARY OF THE INVENTION

The invention proposes a reflectometry system which allows the echo of the signal linked to the impedance mismatch on the coupling interface to be attenuated or eliminated in order to allow the dynamic range of the analog-digital converter to be matched to the signals of low amplitude that correspond to soft cable faults.

Thus, the invention allows amplitude peaks corresponding to soft faults to be located to be amplified, without saturating the dynamic range of the analog-digital converter.

Moreover, the invention can be generalized in order to eliminate all the echoes of the signal associated with reflections on impedance discontinuities linked to the topology of a cable network to be diagnosed. Such impedance discontinuities can notably appear at a junction between two cable sections of different impedances or at the end of a cable or of a section of a cable.

The subject of the invention is a system for analyzing, by reflectometry, faults in a transmission line, the system comprising a test signal generator, a coupler for injecting the test signal into the transmission line and sampling the signal back-propagated in the transmission line, a control unit configured to generate a calibration signal equal to the opposite of the test signal and control its phase and its amplitude, at least one combiner for combining the calibration signal and the signal sampled by the coupler into a corrected signal, an amplifier for amplifying the corrected signal and a correlator for correlating the corrected signal and the test signal to produce a reflectogram, the control unit being further configured to make the amplitude and the phase of the calibration signal vary so as to eliminate, in the signal sampled by the coupler, at least one echo of the test signal on at least one point of impedance mismatch of the transmission line.

According to a particular aspect of the invention, the point of impedance mismatch is the junction point between the coupler and the transmission line.

According to a particular aspect of the invention, the control unit is configured to determine the amplitude and the phase of the calibration signal by analyzing the reflectogram calculated by the correlator, the values selected for the amplitude and the phase being those that allow the cancellation, in the reflectogram, of an amplitude peak corresponding to the at least one echo of the test signal on at least one point of impedance mismatch of the transmission line.

According to a particular aspect, the system according to the invention comprises a first digital-analog converter connected between the test signal generator and the coupler, at least one second digital-analog converter connected between the control unit and the at least one combiner and an analog-digital converter connected between the amplifier and the correlator.

According to a particular aspect of the invention, the control unit is further configured to adjust the amplification gain of the amplifier so that the corrected analog signal occupies the entire dynamic range of the analog-digital converter when the at least one echo is eliminated in the signal sampled by the coupler.

According to a particular aspect of the invention, the control unit is configured to adjust the amplification gain of the amplifier as a function of an indicator of saturation of the analog-digital converter.

According to a particular aspect of the invention, the control unit is configured to adjust the amplification gain of the amplifier as a function of a signal-to-noise ratio criterion measured on the reflectogram calculated by the correlator.

According to a particular aspect of the invention, the control unit is configured to eliminate, in the signal sampled by the coupler, several echoes of the test signal on several points of impedance mismatch of the transmission line by successively executing the following steps, for each echo to be eliminated:

Generating a calibration signal equal to the opposite of the test signal

Determining the amplitude and the phase of the calibration signal so as to eliminate the echo from the signal sampled by the coupler.

According to a particular aspect of the invention, the points of impedance mismatch comprise at least the junction point between the coupler and the transmission line and one point from among a junction point between two sections of the transmission line or one end of a junction of the transmission line.

According to a particular variant, the system according to the invention comprises a first digital-analog converter having a first frequency and a second digital-analog converter having a second frequency higher than the first frequency.

According to a particular variant, the system according to the invention comprises several identical digital-analog converters arranged between an output of the control unit and an input of the combiner to convert, respectively, each of the calibration signals generated by the control unit into analog signals.

According to a particular variant, the system according to the invention comprises several combiners arranged in cascade fashion, each combiner having an input linked to an output of a digital-analog converter.

According to a particular variant, the system according to the invention comprises a device for analyzing the reflectogram calculated by the correlator to analyze the presence of faults on the transmission line.

Also a subject of the invention is a method for analyzing, by reflectometry, faults in a transmission line, the method comprising the steps of:

Injecting a test signal by means of a coupler connected to the transmission line, Acquiring a signal back-propagated in the transmission line, by means of the coupler, Generating a calibration signal equal to the opposite of the test signal and having an amplitude and a controllable phase, Combining the calibration signal and the back-propagated signal to obtain a corrected signal, Determining the amplitude and the phase of the calibration signal so as to eliminate, in the back-propagated signal, at least one echo of the test signal on at least one point of impedance mismatch of the transmission line.

According to a particular variant, the method according to the invention comprises the steps of:

Correlating the corrected signal and the test signal to obtain a reflectogram,

Determining the amplitude and the phase of the calibration signal so as to cancel, in the reflectogram, an amplitude peak corresponding to the at least one echo of the test signal.

According to a particular variant, the method according to the invention comprises the steps of:

Determining an amplification gain of the corrected signal so that the corrected signal occupies the entire dynamic range of the analog-digital converter when the at least one echo is eliminated in the signal sampled by the coupler.

Amplifying the corrected signal with the amplification gain.

BRIEF DESCRIPTION OF THE DRAWINGS

Other features and advantages of the present invention will become more apparent on reading the following description in relation to the attached drawings which represent:

FIG. 1bis, an example of reflectogram obtained with the reflectometry system of FIG. 1, FIG. 2, a diagram of an enhanced reflectometry system according to a first embodiment of the invention, FIGS. 3a and 3b, several time diagrams illustrating the development of a calibration system, FIG. 4, a time diagram illustrating the development of an amplification gain according to an embodiment of the invention, FIG. 5, a diagram illustrating a variant of the problem to be resolved by the invention, FIG. 6, a diagram of a reflectometry system according to a variant of a second embodiment of the invention, FIG. 7, a diagram of a reflectometry system according to another variant of a second embodiment of the invention, FIG. 8, a flow diagram describing the steps of implementation of a reflectometry method according to the invention.

DETAILED DESCRIPTION

Figure 1:
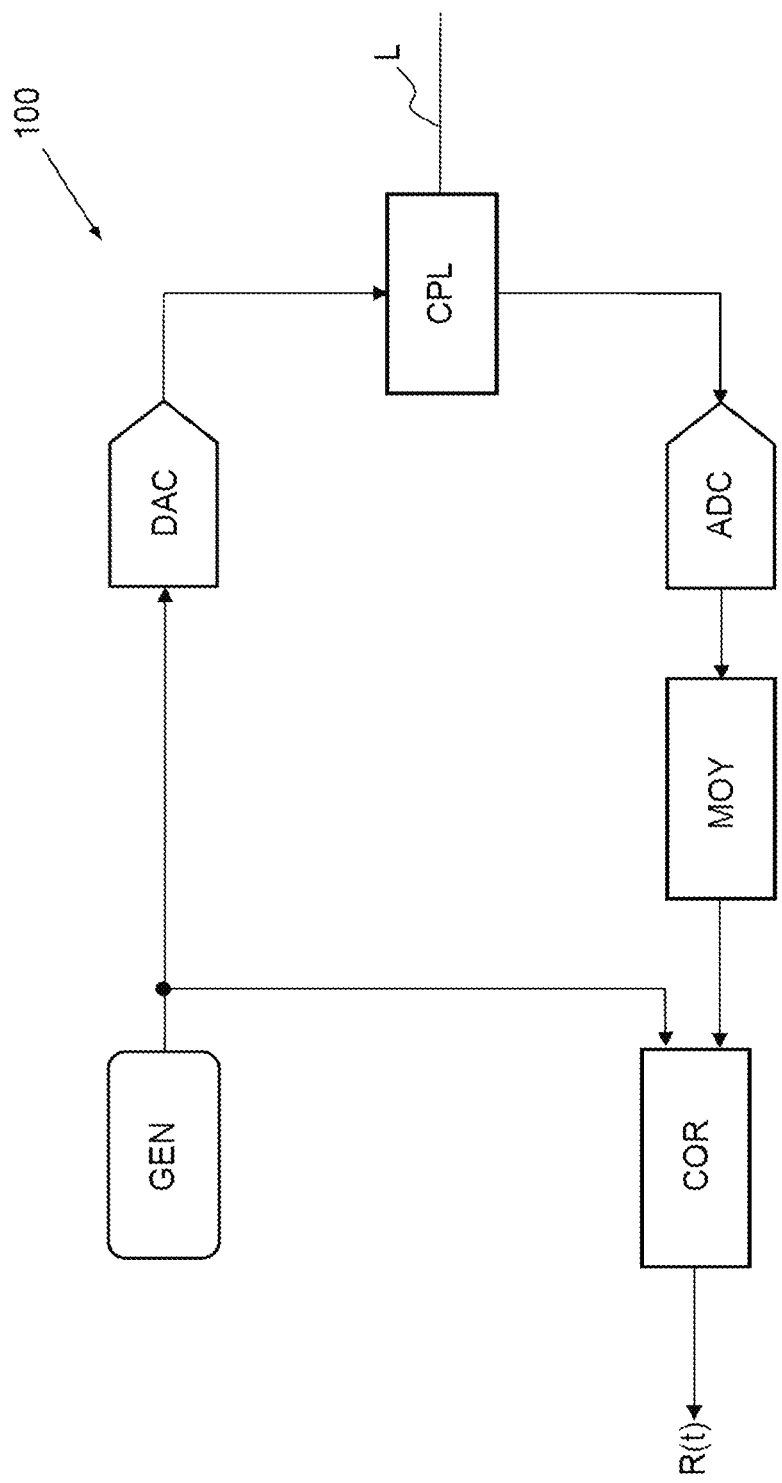
FIG. 1, a diagram of a reflectometry system according to the prior art.

FIG. 1 represents a diagram of a system 100 for analyzing faults in a transmission line L, such as a cable, according to a standard time reflectometry method of the prior art. Such a system mainly comprises a generator GEN of a reference signal. The digital reference signal generated is analogically converted via a digital-analog converter DAC then is injected at a point of the transmission line L by means of a directional coupler CPL or any other device allowing a signal to be injected into a line. The signal is propagated along the line and reflected on the singularities that it includes. In the absence of a fault on the line, the signal is reflected on the end of the line if the line termination is not matched. In the presence of a fault on the line, the signal is reflected on the impedance discontinuity provoked by the fault. The reflected signal is back-propagated to a measurement point, which can be the same as the injection point, or different. The back-propagated signal is measured via the directional coupler CPL then digitally converted by an analog-digital converter ADC. A correlation COR is then performed between the measured digital signal and a copy of the digital signal generated before injection in order to produce a time reflectogram R(t) corresponding to the intercorrelation between the two signals.

As is known in the field of diagnostic methods based on time reflectometry, the position $d_{DF}$ of a fault on the cable L, in other words, its distance to the signal injection point, can be directly obtained from the measurement, on the calculated time reflectogram R(t), of the time $t_{DF}$ between the first amplitude peak recorded on the reflectogram and the amplitude peak corresponding to the signature of the fault.

FIG. 1bis represents an example of reflectogram R(t) obtained using the system of FIG. 1, in which a first amplitude peak $A_0$ is observed at an abscissa N and a second amplitude peak $A_M$ is observed at an abscissa N+M. The first amplitude peak corresponds to the reflection of the signal at the point of injection into the cable, whereas the second peak corresponds to the reflection of the signal on an impedance discontinuity provoked by a fault.

Different known methods can be envisaged to determine the position $d_{DF}$. A first method consists in applying the relationship linking distance and time: $d_{DF}=V_g \cdot t_{DF}/2$, in which $V_g$ is the speed of propagation of the signal in the cable. Another possible method consists in applying a proportionality relationship of the type $d_{DF}/t_{DF}=L_c/t_0$ in which $L_c$ is the length of the cable and $t_0$ is the time, measured on the reflectogram, between the amplitude peak corresponding to the impedance discontinuity at the injection point and the amplitude peak corresponding to the reflection of the signal on the end of the cable. In order to reduce the level of the measurement noise, an optional average calculation MOY can be performed before or after the correlation COR. The two locations of the average calculation are equivalent from an arithmetical point of view.

An analysis device (not represented in FIG. 1) is responsible for analyzing the reflectogram R(t) to deduce therefrom information on the presence and/or location of faults and any electrical characteristics of the faults.

The system of FIG. 1 presents the limitations discussed in the preamble. An echo of the signal injected into the transmission line L on the impedance mismatch between the coupler CPL and the line is overlaid on the signal back-propagated through the line L. Since this echo is not attenuated, it tends to saturate the dynamic range of the analog-digital converter ADC so that it is not possible to amplify the amplitude peaks $A_M$ corresponding to soft faults on the line L.

Figure 2:
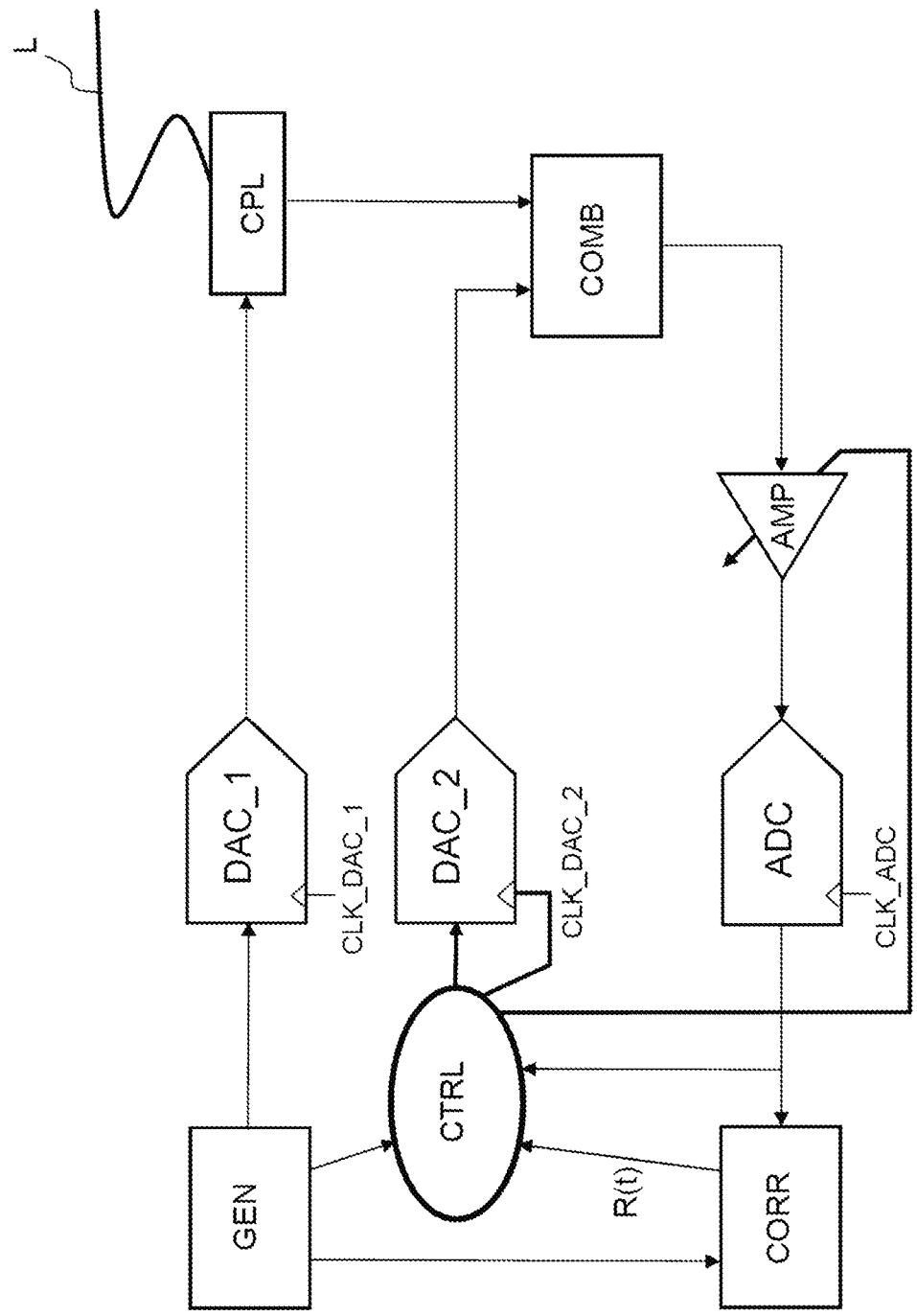

The system of FIG. 2 is proposed to remedy the above-mentioned drawbacks. It comprises some elements that are identical to the system described in FIG. 1, notably a generator GEN of a digital test signal, a first digital-analog converter DAC_1, a coupler CPL to inject the test signal into the transmission line L to be diagnosed and acquiring an echo of the signal back-propagated in the line, an analog-digital converter ADC and a correlator CORR to produce a reflectogram of the type of that of FIG. 1bis from the acquired signal and the signal generated by the generator GEN.

The test signal used can be any type of time or frequency reflectometry signal. For example, it can be a multicarrier signal of OMTDR (Orthogonal Multi-tone Time Division Multiplexing) type. The test signal can be periodic so as to be injected continuously into the line L in the form of repeated sequences.

The system according to one embodiment of the invention described in FIG. 2 further comprises a control signal CTRL, a second digital-analog converter DAC_2, a combiner COMB and an amplifier AMP.

The control unit CTRL is configured to generate a calibration signal that is opposite with respect to the test signal produced by the generator GEN. The opposite signal is composed therein from the samples of the test signal x to which an opposing sign, y=−x, is applied. Moreover, the phase and the amplitude of the calibration signal are adjustable. The calibration signal is converted into an analog signal (by the converter DAC_2) then combined with the signal acquired by the coupler CPL by means of a passive or active combiner COMB which is a component capable of summing two analog signals. The corrected signal at the output of the combiner COMB is amplified by an amplifier AMP then digitally converted (by the converter ADC). A reflectogram is calculated by the correlator CORR which transmits it to the control unit CTRL which adjusts the phase and the amplitude of the calibration signal so as to cancel the echo of the signal on the coupling interface between the coupler and the line L, in the output signal from the combiner COMB.

One function of the control unit CTRL is to generate a signal which allows, after combination with the signal sampled by the coupler CPL, cancellation of the echo of the signal injected on the coupling interface between the coupler and the line L. This echo corresponds, in the reflectogram calculated by the correlator CORR, to the first amplitude peak A1. To cancel this echo, one possible method is to adjust the phase (or the delay) and the amplitude of the calibration signal in the manner illustrated in FIGS. 3a and 3b.

Figure 3A:
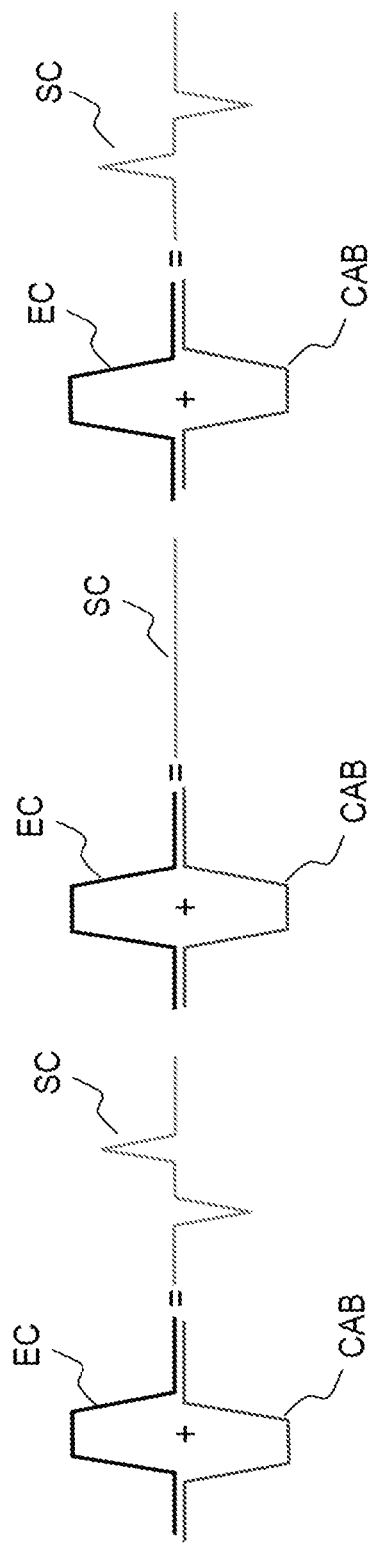

In FIG. 3a, three time diagrams are represented, representing the time reflectograms corresponding on one hand to the echo EC of the signal to be cancelled and to the calibration signal CAB, and, on the other hand, to the overlay of the two signals after their combination, in other words to the output signal SC from the combiner COMB. In all the cases, the calibration signal CAB is opposite with respect to the echo EC.

In FIG. 3a, a first case (figure on the left) is illustrated for which the calibration signal CAB presents a phase shift or a delay with respect to the echo EC, a second case (figure on the right) also presenting a phase shift between these two signals and a third case (figure in the middle) for which the two signals EC, CAB are in phase and the signal resulting from the combination of the two is zero.

Figure 3B:
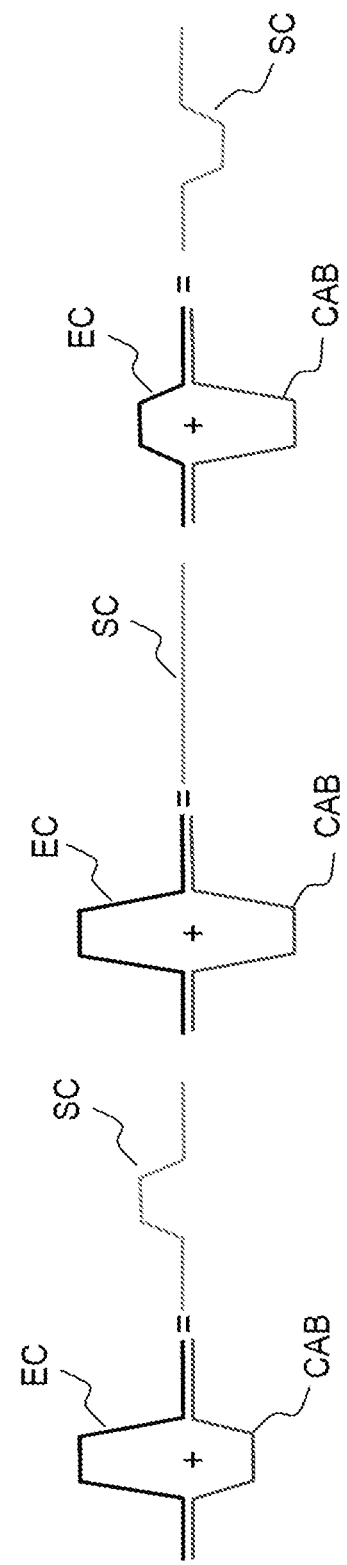

Likewise, FIG. 3b represents two cases (figures on the right and on the left) for which the amplitude of the calibration signal CAB is different from that of the echo EC and a third case (figure in the middle) for which the two signals EC, CAB have the same absolute amplitude and the signal resulting from the combination of the two is zero.

FIGS. 3a and 3b illustrate a method allowing the amplitude and the phase of the calibration signal CAB to be determined.

In a first step, the calibration signal is generated as being equal to the opposite of the test signal and with an amplitude attenuated by at least half with respect to the amplitude of the test signal.

Then, the calibration signal is transmitted to the input of the combiner COMB and a reflectogram is calculated by the correlator CORR. By analyzing this reflectogram, the control unit adjusts either the phase, or the amplitude of the calibration signal, or both at the same time, to succeed in cancelling the first peak of the reflectogram as illustrated in the diagrams in the middle of FIGS. 3a and 3b. In fact, when one of the two signals is delayed, the sum of the two signals around the zone of mismatch has an oscillating behavior, going from a positive peak to a negative peak or vice versa.

The adjustment can be done iteratively in several iterations of the two preceding steps. On each iteration, the calibration signal is modified, for example by a phase or amplitude increment, then the resulting reflectogram is analyzed and this is repeated until the first peak corresponding to the echo EC is cancelled.

One possible criterion for stopping the iterations consists in calculating an error criterion in the time zone around the first peak of the reflectogram and in comparing this error to a threshold below which it is considered that the peak is substantially zero. Any equivalent criterion exploiting the sum, the average or any suitable type of mathematical distance can be used to automate this method. For example, one simple criterion consists in summing the values of the points of the reflectogram within a time zone around the peak that is wanted to be cancelled. This sum is then compared to a threshold below which the peak is considered to be sufficiently attenuated.

Once the phase and the amplitude of the calibration signal CAB are determined, the system is capable of being able to amplify the signals acquired by the coupler CPL without saturating the dynamic range of the analog-digital converter ADC.

The gain of the amplifier AMP is adjusted so as to amplify the signal without saturating the converter ADC while allowing a better detection of the peaks of low amplitude corresponding to the soft faults.

To adjust this gain, a first method consists in making the amplification gain vary and in analyzing the signal at the output of the converter ADC to detect the number of samples which are saturated. When the number of samples or the sample rate exceeds a predetermined threshold, it is decided that the gain is optimal and that, beyond this gain, an excessive saturation will occur. The threshold is for example equal to ⅓ of the saturated samples.

A second method consists in making the amplification gain vary and in analyzing the reflectograms determined by the correlator CORR for each gain.

Figure 4:
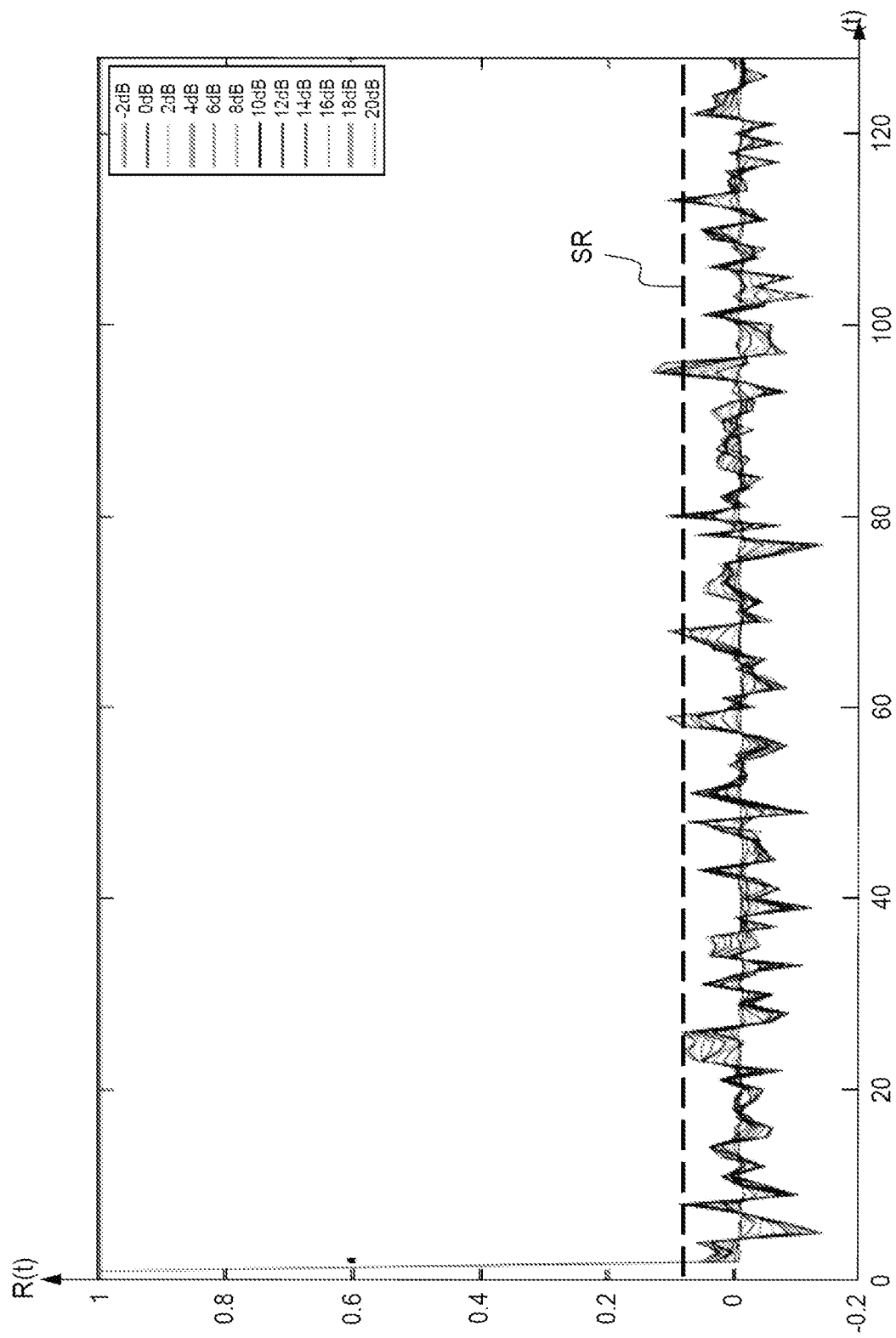

FIG. 4 represents a time diagram on which there are illustrated several reflectograms obtained for different gain values varying from −2 dB to 20 dB in the absence of faults. A threshold $S_R$ is set and compared to all of the points of the reflectogram. The threshold $S_R$ corresponds to a fault detection threshold. In other words, it is set so as to be able to detect soft faults whose signature is above this threshold. The lower this threshold, the more possible it is to detect signatures of low amplitude. By contrast, the false alarm rate also tends to increase because the noise linked to the saturation of the acquired signal generates peaks which can be confused with fault signatures. In fact, when the signal acquired by the analog-digital converter ADC is saturated, that generates a noise at the output of the correlation calculation. The more saturated the converter ADC, the more significant the correlation noise. Thus, one method for determining the optimal amplification gain consists in choosing the maximum gain for which the number of points exceeding this threshold is below a predetermined value. In other words, the number of points corresponding to peaks of the quantization noise is limited.

Another embodiment of the invention is now described for which the principle described above is widened in order to eliminate, in the signal sampled by the coupler CPL, one or more echoes of the signal on one or more impedance discontinuities associated with characteristic points of the topology of a cable network. These characteristic points notably comprise junction points between two cable branches not having the same characteristic impedance or end points of cables or of cable junctions. More generally, a characteristic point is a point of a cable network where there is an impedance discontinuity which is known because it is linked to the topology of the network and not to a fault. These impedance discontinuities cause reflections of the signals which are back-propagated and which are added to the reflections on the discontinuities linked to the fault. In the final reflectogram, these reflectograms result in amplitude peaks which can mask the peaks linked to the faults which are often of lower amplitude.

Figure 5:
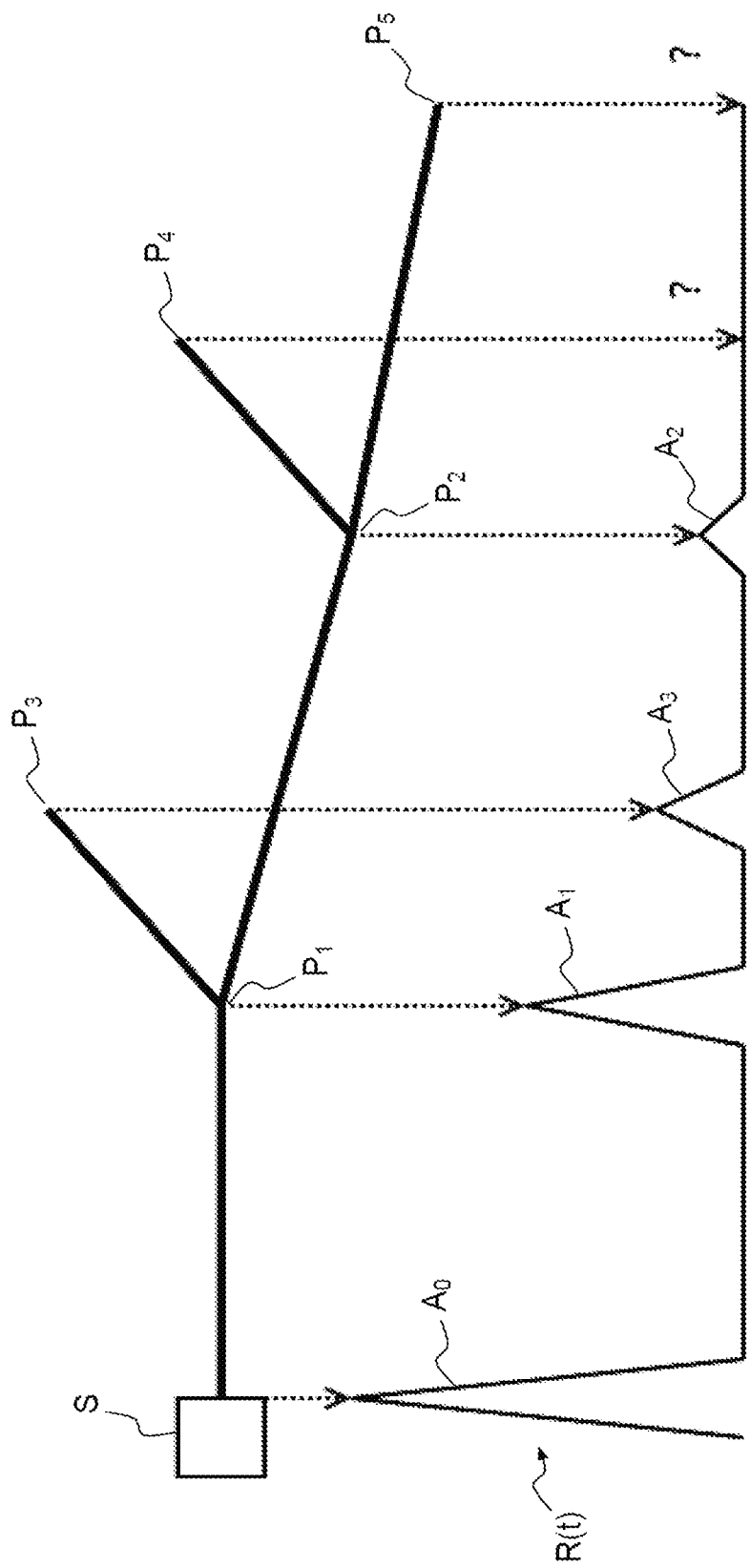

FIG. 5 illustrates, in a diagram, an example of cable network comprising two points P1, P2 situated at junctions between different branches of the network and three points P3, P4, P5 situated at ends of the cable junctions of the network. By performing an analysis of this network using a reflectometry system S, the time reflectogram R(t) obtained by the correlator CORR is represented on the bottom in FIG. 5. It comprises several correlation peaks corresponding to different characteristic points of the cable network. The peak $A_0$ corresponds to an impedance discontinuity between the coupler CPL and the cable. The peaks $A_1, A_3, A_2$ correspond respectively to the impedance discontinuities provoked by the points $P_1, P_3, P_2$. The correlation peaks of the reflectogram are increasingly attenuated with the distance which increases between the characteristic point and the reflectometry system S.

FIG. 5 illustrates the fact that it may be desirable to cancel some of the peaks which can mask weaker correlation peaks corresponding to faults that are wanted to be detected.

In a second embodiment of the invention, the device described in FIG. 2 is modified as follows in order to eliminate, in the signal sampled by the coupler CPL, one or more echoes of the signal injected on one or more characteristic points of a cable network.

A second digital-analog converter DAC_2 has a sample frequency higher than that of the first digital-analog converter DAC_1 in order to be able to generate signals with finer phase-shifts. This functionality is necessary to allow the generation of calibration signals in phase with the echoes that are wanted to be cancelled and which do not necessarily have multiple delays of the sample period of the first digital-analog converter DAC_1. In fact, the delays of the different echoes are linked to the distances between the coupler CPL and the characteristic points $P_1, P_3, P_2$ and do not necessarily correspond to multiples of the period of a single clock. For that reason, it is necessary to use a converter DAC_2 with a high sampling frequency.

The control unit CTRL is configured to iterate the operation described previously to cancel the mismatch echo between the coupler and the line L, in order to cancel one or more other echoes. For that, for each new echo to be eliminated, the control unit CTRL generates a new calibration signal which is overlaid on the calibration signal previously generated. By analysis of the reflectogram calculated by the correlator CORR around a time zone corresponding to the zone of the echo that is wanted to be cancelled, the control unit CTRL determines the amplitude and the phase of the second calibration signal which is added to the first calibration signal. The knowledge of the topology of the cable network can be used to limit the ranges of variation of the phase and of the amplitude of the signals generated by the control unit CTRL, for example by limiting the values of the phase shifts to a range of delays calculated from the distance between the point of injection of the signal and the point of impedance mismatch associated with the echo that is wanted to be eliminated. This process is iterated for each echo to be eliminated. The final calibration signal which is produced on an input of the combiner COMB corresponds to the overlay of several calibration signals each corresponding to an echo to be eliminated.

Figure 6:
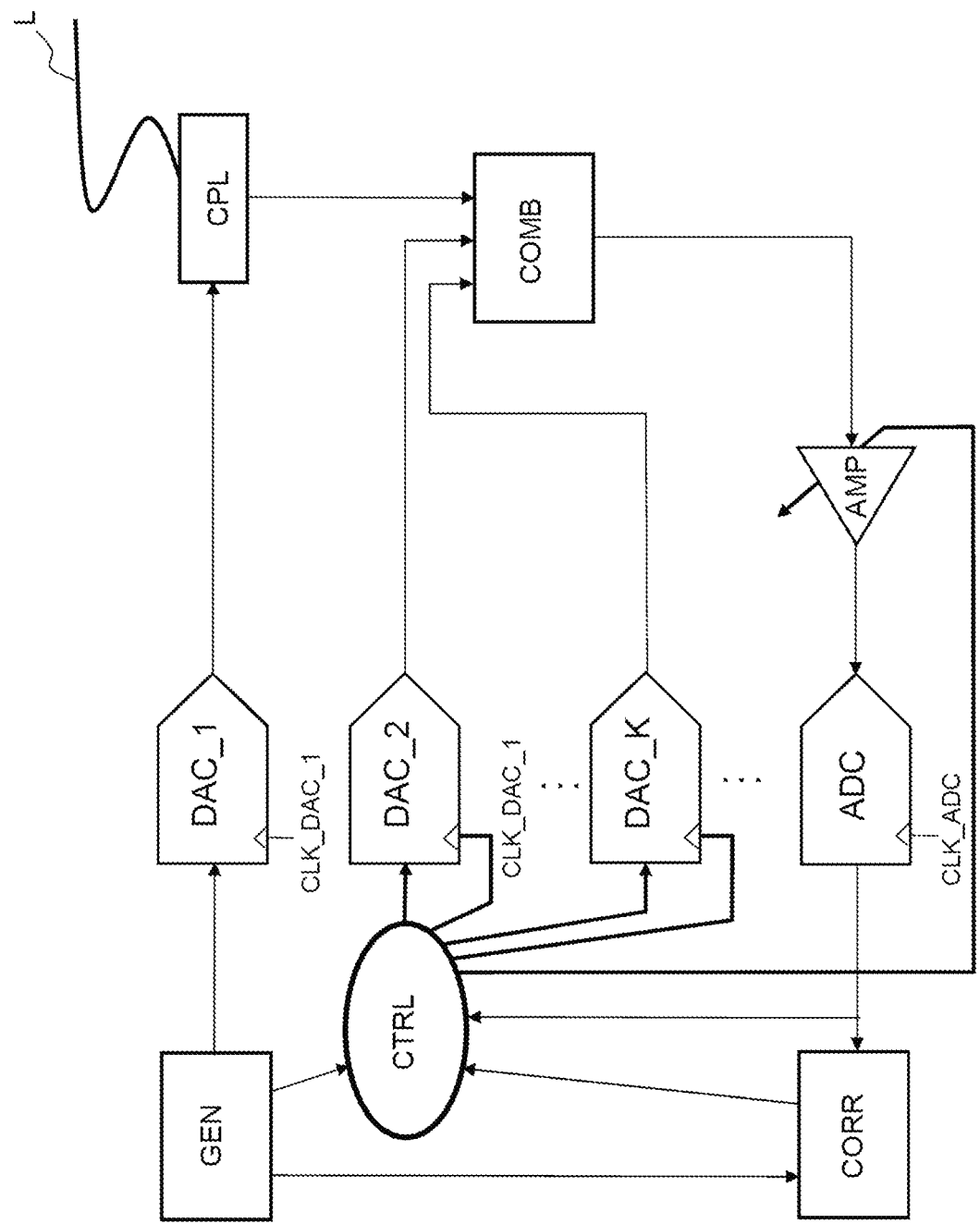

FIG. 6 represents a variant of the second embodiment of the invention in which several digital-analog converters DAC_2 . . . DAC_K are used, in parallel to generate as many calibration signals as echoes to be cancelled. The converters DAC_2, . . . DAC_K are identical to the first converter DAC_1 and in particular have the same sampling frequency. Because of this, it is necessary to use a converter for each echo to be eliminated in order to be able to accurately adjust the phase shift of the calibration signal for each echo.

All the output signals of the different converters DAC_2, . . . DAC_K are produced at the input of the combiner COMB to be combined with the signal to be sampled by the coupler CPL in order to cancel the different undesirable echoes.

Figure 7:
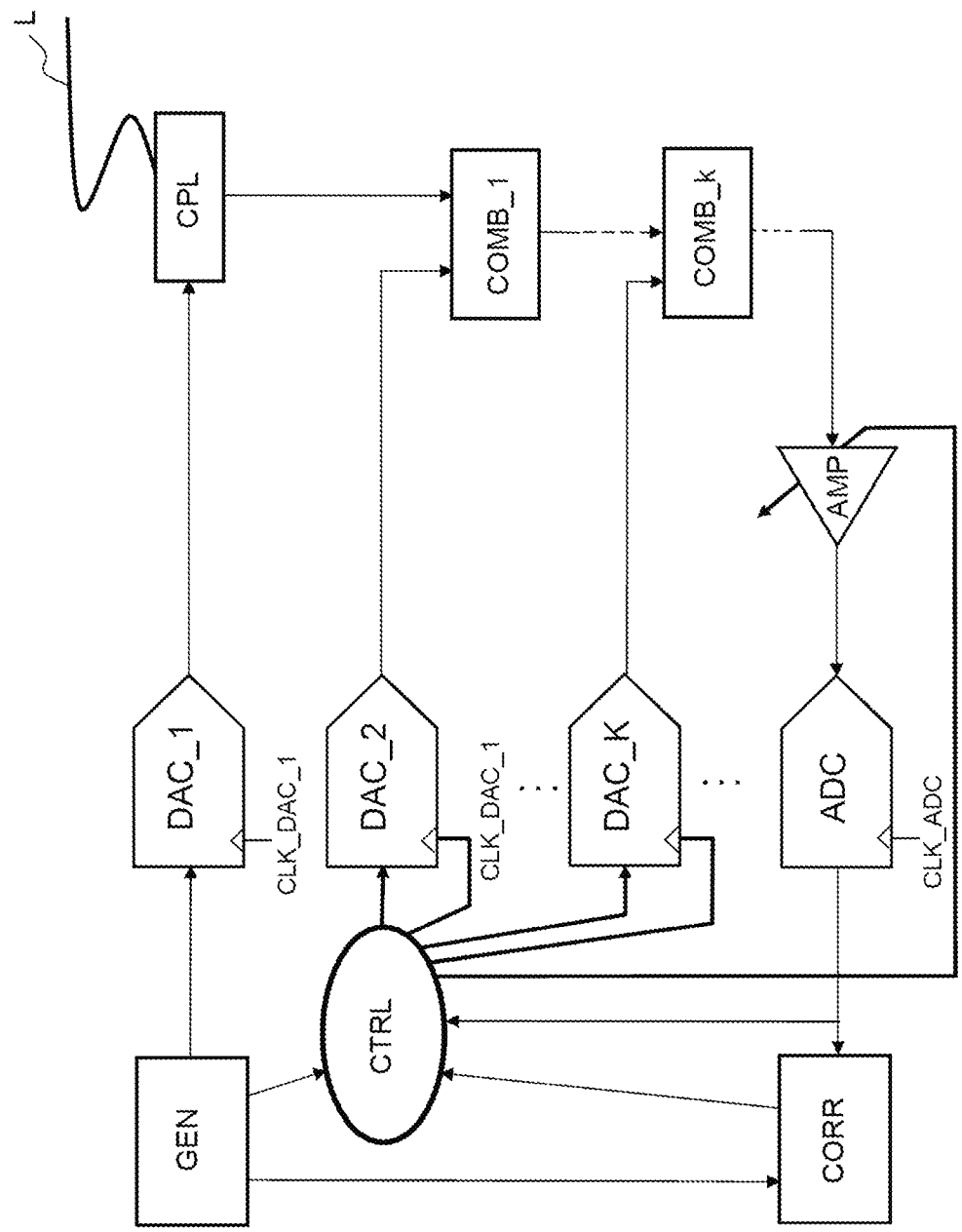

FIG. 7 represents another variant of the second embodiment of the invention in which several combiners COMB_1, . . . , COMB_k each having two inputs, are used to successively add the calibration signals to the signal sampled by the coupler CPL.

Figure 8:
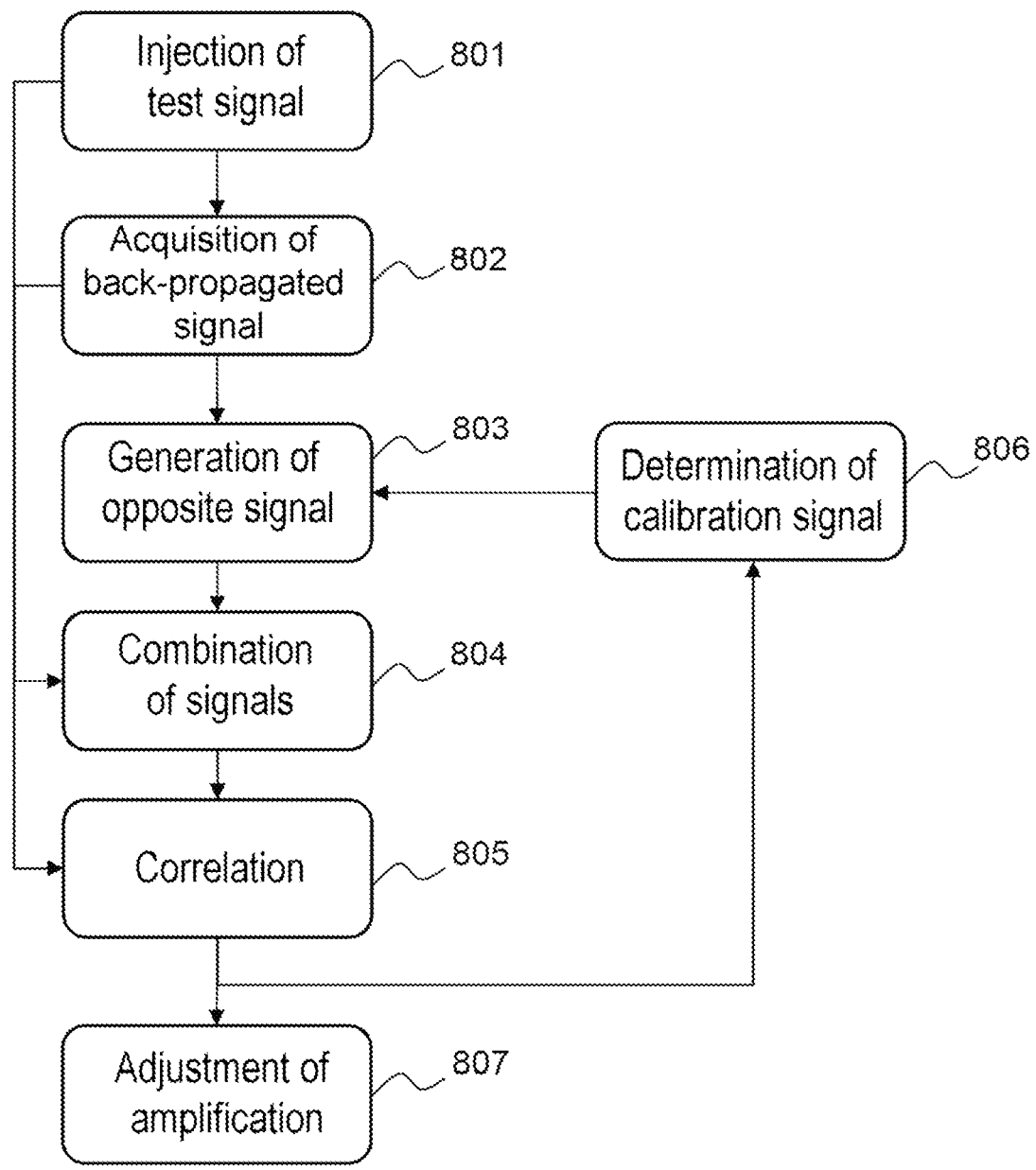

FIG. 8 schematically represents, in a flow diagram, the steps of implementation of a reflectometry method according to the invention.

In a first step 801, a test signal is injected into the line L or the network of lines to be analyzed. The test signal is generated by a generator GEN and injected by means of a coupler CPL or any other equivalent injection means.

In a second step 802, the signal is sampled or acquired after back-propagation thereof in the line L or the network of lines. The acquisition of the back-propagated signal is performed by means of the coupler CPL or any other equivalent measurement means.

In a third step 803, the control unit CTRL generates a signal that is opposite to the reference signal and attenuated with respect to the reference signal.

In a fourth step 804, the opposite signal is combined with the signal acquired in the step 802 in order to cancel the echo of the signal on the impedance discontinuity between the coupler CPL and the line L.

In a fifth step 805, the correlator CORR determines, by correlation between the test signal and the signal combined in the step 804, a time reflectogram which is transmitted to the control unit CTRL to be analyzed.

In a sixth step 806, the control unit CTRL adjusts the phase (or the delay) and the amplitude of the opposite signal in order to determine a calibration signal which allows cancellation, in the reflectogram, of the correlation peak corresponding to the echo to be eliminated. For that, the steps 803, 804, 805 and 806 can be iterated.

When the calibration signal is determined, the steps 803, 804, 805, 806 can be renewed to generate another calibration signal aiming to cancel another echo of the signal on another impedance discontinuity. The final calibration signal results from the combination of the different calibration signals generated for each echo to be eliminated.

Once the final calibration signal is determined for all of the echoes to be eliminated, the amplification gain is adjusted 807 so as to match the amplification to the signatures of soft faults.

The system according to any one of the variant embodiments of the invention can be implemented by an electronic circuit board on which the various components are disposed. The board can be connected to the cable to be analyzed by a coupling means CPL which can be a directional coupler with capacitive or inductive effect or even an ohmic connection. The coupling device can be produced by physical connectors which link the signal generator to the cable or by contactless means, for example by using a metal cylinder whose inner diameter is substantially equal to the outer diameter of the cable and which produces an effect of capacitive coupling with the cable.

Furthermore, a processing unit of computer or personal digital assistant type, or other equivalent electronic or computing device, can be used to drive the system according to the invention and display the results of the calculations performed by the correlator CORR on a human-machine interface, in particular the reflectogram R(t) and/or the information on detection and location of faults on the cable.

The method according to the invention, in particular the control unit CTRL, can be implemented in an embedded processor or in a specific device. The processor can be a generic processor, a specific processor, an application-specific integrated circuit (known also by the acronym ASIC) or a field-programmable gate array (also known by the acronym FPGA). The device according to the invention can use one or more dedicated electronic circuits or a general-purpose circuit. The technique of the invention can be implemented on a reprogrammable computation machine (a processor or a microcontroller for example) running a program comprising a sequence of instructions, or on a dedicated computation machine (for example a set of logic gates like an FPGA or an ASIC, or any other hardware module).

The invention claimed is:

1. A system for analyzing, by reflectometry, faults in a transmission line (L), the system comprising a test signal generator (GEN), a coupler (CPL) for injecting the test signal into the transmission line (L) and sampling the signal back-propagated in the transmission line, a control unit (CTRL) configured to generate a calibration signal, the samples of which are equal to the opposite of the samples of the test signal and to control the phase and the amplitude of the calibration signal, at least one combiner (COMB) for combining the calibration signal and the signal sampled by the coupler into a corrected signal, an amplifier (AMP) for amplifying the corrected signal and a correlator (CORR) for correlating the corrected signal and the test signal to produce a reflectogram, the control unit (CTRL) being further configured to make the amplitude and the phase of the calibration signal vary so as to eliminate, in the signal sampled by the coupler (CPL), at least one echo of the test signal on at least one point of impedance mismatch of the transmission line (L).

2. The system for analyzing faults as claimed in claim 1, wherein the point of impedance mismatch is the junction point between the coupler (CPL) and the transmission line (L).

3. The system for analyzing faults as claimed in claim 1, wherein the control unit (CTRL) is configured to determine the amplitude and the phase of the calibration signal by analyzing the reflectogram calculated by the correlator (CORR), the values selected for the amplitude and the phase being those that allow the cancellation, in the reflectogram, of an amplitude peak corresponding to the at least one echo of the test signal on at least one point of impedance mismatch of the transmission line (L).

4. The system for analyzing faults as claimed in claim 1, wherein the system comprises a first digital-analog converter (DAC_1) connected between the test signal generator (GEN) and the coupler (CPL), at least one second digital-analog converter (DAC_2) connected between the control unit (CTRL) and the at least one combiner (COMB) and an analog-digital converter (ADC) connected between the amplifier (AMP) and the correlator (CORR).

5. The system for analyzing faults as claimed in claim 4, wherein the control unit (CTRL) is further configured to adjust the amplification gain of the amplifier (AMP) so that the corrected analog signal occupies the entire dynamic range of the analog-digital converter (ADC) when the at least one echo is eliminated in the signal sampled by the coupler (CPL).

6. The system for analyzing faults as claimed in claim 5, wherein the control unit (CTRL) is configured to adjust the amplification gain of the amplifier (AMP) as a function of an indicator of saturation of the analog-digital converter (ADC).

7. The system for analyzing faults as claimed in claim 5, wherein the control unit (CTRL) is configured to adjust the amplification gain of the amplifier (AMP) as a function of a signal-to-noise ratio criterion measured on the reflectogram calculated by the correlator (CORR).

8. The system for analyzing faults as claimed in claim 4, wherein the control unit (CTRL) is configured to eliminate, in the signal sampled by the coupler (CPL), several echoes of the test signal on several points of impedance mismatch of the transmission line (L) by successively executing the following steps, for each echo to be eliminated:
   generating a calibration signal, the samples of which are equal to the opposite of those of the test signal,
   determining the amplitude and the phase of the calibration signal so as to eliminate the echo from the signal sampled by the coupler (CPL).

9. The system for analyzing faults as claimed in claim 8, wherein the points of impedance mismatch comprise at least the junction point between the coupler (CPL) and the transmission line (L) and one point from among a junction point between two sections of the transmission line or one end of a junction of the transmission line (L).

10. The system for analyzing faults as claimed in claim 8, wherein the first digital-analog converter (DAC_1) has a first frequency and the second digital-analog converter (DAC_2) has a second frequency higher than the first frequency.

11. The system for analyzing faults as claimed in claim 8, comprising at least one additional digital-analog converter (DAC_K), the digital-analog converters (DAC_1, DAC_2, DAC_K) being identical, at least some of the digital-analog converters (DAC_2,DAC_K) being arranged between an output of the control unit (CTRL) and an input of the combiner (COMB) to convert, respectively, each of the calibration signals generated by the control unit into analog signals.

12. The system for analyzing faults as claimed in claim 11, comprising several combiners (COMB_1, ... COMB_k) arranged in cascade fashion, each combiner having an input linked to an output of one of the digital-analog converters (DAC_2,DAC_K).

13. The system for analyzing faults as claimed in claim 1, comprising a device for analyzing the reflectogram calculated by the correlator (CORR) to analyze the presence of faults on the transmission line (L).

14. A method for analyzing, by reflectometry, faults in a transmission line (L), the method comprising the steps of:
   injecting a test signal by means of a coupler (CPL) connected to the transmission line (L),
   acquiring a signal back-propagated in the transmission line, by means of the coupler (CPL),
   generating a calibration signal, the samples of which are equal to the opposite of those of the test signal and having an amplitude and a controllable phase,
   combining the calibration signal and the back-propagated signal to obtain a corrected signal,
   determining the amplitude and the phase of the calibration signal so as to eliminate, in the back-propagated signal, at least one echo of the test signal on at least one point of impedance mismatch of the transmission line (L).

15. The method for analyzing faults as claimed in claim 14, comprising the steps of:
   correlating the corrected signal and the test signal to obtain a reflectogram,
   determining the amplitude and the phase of the calibration signal so as to cancel, in the reflectogram, an amplitude peak corresponding to the at least one echo of the test signal.

16. The method for analyzing faults as claimed in claim 14, comprising the steps of:
   determining an amplification gain of the corrected signal so that the corrected signal occupies the entire dynamic range of an analog-digital converter (ADC) when the at least one echo is eliminated in the signal sampled by the coupler (CPL),
   amplifying the corrected signal with the amplification gain.

* * * * *